(12) United States Patent
Schmidt

(10) Patent No.: US 10,008,590 B2
(45) Date of Patent: Jun. 26, 2018

(54) SEMICONDUCTOR DEVICE WITH TRENCH EDGE TERMINATION

(71) Applicant: Infineon Technologies AG, Neubiberg (DE)

(72) Inventor: Gerhard Schmidt, Wernberg-Wudmath (AT)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/367,633

(22) Filed: Dec. 2, 2016

(65) Prior Publication Data

US 2017/0162679 A1 Jun. 8, 2017

(30) Foreign Application Priority Data

Dec. 3, 2015 (DE) .................. 10 2015 121 100

(51) Int. Cl.
| | |
|---|---|
| *H01L 29/739* | (2006.01) |
| *H01L 27/06* | (2006.01) |
| *H01L 29/06* | (2006.01) |
| *H01L 29/16* | (2006.01) |
| *H01L 29/20* | (2006.01) |
| *H01L 29/36* | (2006.01) |

(52) U.S. Cl.
CPC ...... *H01L 29/7396* (2013.01); *H01L 27/0635* (2013.01); *H01L 29/0615* (2013.01); *H01L 29/0638* (2013.01); *H01L 29/0649* (2013.01); *H01L 29/1602* (2013.01); *H01L 29/1608* (2013.01); *H01L 29/2003* (2013.01); *H01L 29/36* (2013.01); *H01L 29/7395* (2013.01)

(58) Field of Classification Search
CPC ............ H01L 29/7396; H01L 29/7395; H01L 29/0649; H01L 29/0638
See application file for complete search history.

(56) References Cited

U.S. PATENT DOCUMENTS

| | | | |
|---|---|---|---|
| 7,868,396 B2 | 1/2011 | Rueh et al. | |
| 9,082,843 B2 | 7/2015 | Schmidt | |
| 2007/0200183 A1* | 8/2007 | Rueb ................... | H01L 29/0611 257/401 |
| 2009/0008723 A1* | 1/2009 | Schmidt ............ | H01L 21/26586 257/409 |

(Continued)

FOREIGN PATENT DOCUMENTS

| | | |
|---|---|---|
| DE | 10 2005 038 260 B3 | 3/2007 |
| DE | 10 2006 004 405 A1 | 8/2007 |

(Continued)

*Primary Examiner* — Benjamin Sandvik
*Assistant Examiner* — Farid Khan
(74) *Attorney, Agent, or Firm* — Volpe and Koenig, P.C.

(57) ABSTRACT

A semiconductor device is provide that includes: a semiconductor body having a first surface, an inner region, and an edge region; a pn junction between a first semiconductor region of a first conductivity type and a second semiconductor region of a second conductivity type, the pn-junction extending in a lateral direction of the semiconductor body in the inner region; a recess extending from the first surface in the edge region into the semiconductor body, the recess comprising at least one sidewall; a dielectric filling the recess. In the dielectric, a dielectric number, in the lateral direction, decreases as a distance from the first sidewall increases.

26 Claims, 7 Drawing Sheets

(56) References Cited

U.S. PATENT DOCUMENTS

| | | | | |
|---|---|---|---|---|
| 2012/0286355 A1* | 11/2012 | Mauder | ............... | H01L 21/0228 |
| | | | | 257/330 |
| 2012/0306046 A1* | 12/2012 | Schmidt | .............. | H01L 29/0638 |
| | | | | 257/506 |
| 2013/0069109 A1* | 3/2013 | Matsuda | ........... | H01L 29/66734 |
| | | | | 257/139 |
| 2013/0292740 A1* | 11/2013 | Yamashita | .......... | H01L 27/0629 |
| | | | | 257/162 |
| 2014/0167143 A1* | 6/2014 | Schmidt | ............ | H01L 21/26586 |
| | | | | 257/329 |
| 2016/0343823 A1* | 11/2016 | Akram | .................. | H01L 29/513 |

FOREIGN PATENT DOCUMENTS

| | | |
|---|---|---|
| DE | 10 2013 113 939 A1 | 6/2014 |
| JP | 2013251338 | * 12/2013 |

\* cited by examiner

SEMICONDUCTOR DEVICE WITH TRENCH EDGE TERMINATION

FIELD

The present disclosure relates to a semiconductor device, and in particular, a power semiconductor device with a vertical edge termination (mesa edge termination).

BACKGROUND

Power semiconductor devices, such as power diodes, power metal-oxide semiconductor field-effect transistors (MOSFETs), power insulated-gate bipolar transistor (IGBTs) or power thyristors, are designed to withstand high blocking voltages. Those power devices include a pn-junction formed between a p-doped semiconductor region and an n-doped semiconductor region. The device blocks (is switched off) when the pn-junction is reverse biased by applying a voltage to the pn-junction. In this case a depletion region or space charge region expands in the p-doped region and the n-doped region. Usually one of these p-doped and n-doped regions is more lightly doped than the other one of these p-doped and n-doped regions, so that the depletion region mainly expands in the more lightly doped region, which mainly supports the voltage applied across the pn-junction. The more lightly doped region supporting the blocking voltage is usually referred to as base region in a diode or thyristor and drift region in a MOSFET or IGBT.

The ability of a pn-junction to support high voltages is limited by the avalanche breakdown phenomenon. As a voltage applied across a pn-junction increases, an electric field in the semiconductor regions forming the pn-junction increases. The electric field results in acceleration of mobile carriers induced by thermal generation in the space charge region. An avalanche breakdown occurs when, due to the electric field, the charge carriers are accelerated such that they create electron-hole pairs by impact ionization. Charge carriers created by impact ionization create new charge carriers, so that there is a multiplication effect. At the onset of avalanche breakdown a significant current flows across the pn-junction in the reverse direction. The electric field at which the avalanche breakdown sets in is referred to as critical electric field. The absolute value of the critical electric field is mainly dependent on the type of semiconductor material used for forming the pn-junction, and is weakly dependent on the doping concentration of the more lightly doped semiconductor region. A voltage blocking capability of the semiconductor device is the voltage applied to the pn-junction at which the critical electric field occurs in the semiconductor device. This voltage is often referred to as breakdown voltage.

The voltage blocking capability is not only dependent on the type of semiconductor material and its doping, but also on the specific geometry of the semiconductor device. A power semiconductor device includes a semiconductor body of finite size that is terminated by edge surfaces in lateral directions of the semiconductor body. In a vertical power semiconductor device, which is a semiconductor device in which the pn-junction mainly extends in a horizontal plane of the semiconductor body, the pn-junction usually does not extend to the edge surface of the semiconductor body. Instead, the pn-junction is distant to the edge surface of the semiconductor body in a lateral direction. In this case, a semiconductor region (edge region) of the semiconductor body adjoining the pn junction in the lateral direction also has to withstand the voltage applied to the pn-junction.

The edge region could be implemented with a planar edge termination structure. In this case, however, the dimension of the edge region in the lateral direction of the semiconductor body is usually a least between two times and three times the dimension (length) of the drift region (base region) in the vertical direction. The length of the drift region (base region) is dependent on the desired voltage blocking capability of the device and can be up to several 10 micrometers ($\square$m), so that a corresponding edge termination would be very space consuming.

In order to reduce the space required for withstanding the blocking voltage in the edge region, a vertical edge termination, which is also referred to as mesa edge termination, can be provided. Such vertical edge termination includes a trench filled with a dielectric material. Suitable dielectric materials such as benzocyclobutene (BCB) based dielectrics, to name only one, have a high dielectric strength of several MV/cm and a low leakage current. However, the leakage current may increase as the electric field strength increases. In a mesa edge termination, the electric field strength can be particularly high at an interface between the semiconductor material surrounding the trench and the dielectric material, so that increased leakage currents may occur in these regions.

There is therefore a need for an improved edge termination for semiconductor devices, in particular semiconductor devices having a semiconductor body with a rectangular geometry.

SUMMARY

One aspect relates to a semiconductor device. The semiconductor device includes a semiconductor body with a first surface, an inner region, and an edge region. A pn junction is located between a first semiconductor region of a first conductivity type and a second semiconductor region of a second conductivity type, wherein the pn-junction extends in a lateral direction of the semiconductor body in the inner region. In the edge region, a recess extends from the first surface into the semiconductor body and includes at least one sidewall. Furthermore, a dielectric fills the recess, wherein, in the lateral direction of the dielectric, a relative dielectric number decreases as a distance from the first sidewall increases.

BRIEF DESCRIPTION OF THE DRAWINGS

Examples are explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

Figure 1:
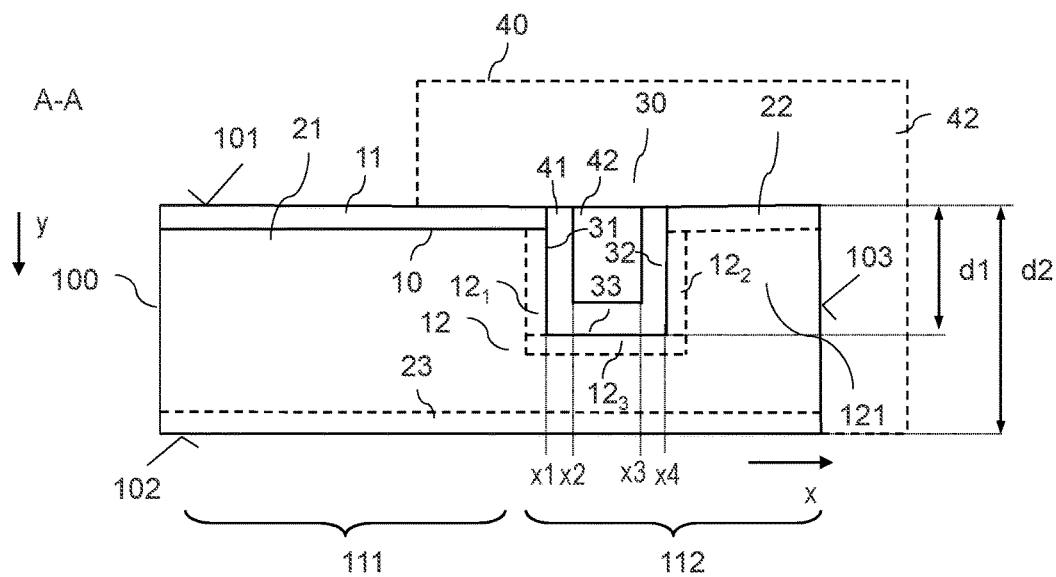
FIG. 1 shows a vertical cross sectional view of an edge region of a semiconductor device.

FIG. 1 shows a vertical cross sectional view of a part of a semiconductor device. In particular, FIG. 1 shows a vertical cross sectional view of an edge region 112 and a part of an inner region of a semiconductor body (or semiconductor layer) 100 including active regions of the semiconductor device. The semiconductor body 100 includes a first surface 101 and a second surface 102 opposite the first surface 102. Essentially, the first surface 101 and the second surface 102 are parallel. FIG. 1 shows a vertical cross sectional view of the semiconductor body 100 in a section plane that runs perpendicular to the first and second surfaces 101, 102. The semiconductor body may include a conventional monocrystalline semiconductor material such as silicon (Si), silicon carbide (SiC), gallium nitride (GaN), diamond, or the like.

Referring to FIG. 1, the edge region 112 is arranged between the inner region 111 and an edge surface 103. The edge surface 103 extends between the first and the second surfaces 101, 102 and terminates the semiconductor body 100 in a lateral direction, while the first and second surfaces 101, 102 terminate the semiconductor body 100 in a vertical direction. The "vertical direction" is a direction perpendicular to the first and second surfaces 101, 102, while the "lateral direction" or "horizontal direction" is perpendicular to the vertical direction. According to one example the edge surface 103 is a vertical surface, that is, a surface that is perpendicular to the first surface 101 and the second surface 101, 102. However, this is only an example. According to another example (not shown), the edge surface 103 is beveled so that an angle between the edge surface 103 and each of the first surface 101 and the second surface is different from 90°

The term "surface" as used in this disclosure is used for those planes that terminate the semiconductor body 100. In particular, the term "surface" is also used for those surfaces that, after the device has been completed, are covered by other layers such as electrode layers, passivation layers, etc. Such additional layers, however, are not illustrated in FIG. 1.

FIG. 1 illustrates only a part of a cross section of the semiconductor device, namely that part that includes the edge region 112 and the edge surface on one lateral side of the semiconductor body 100 and only a part of the inner region 111. In a horizontal plane of the semiconductor body 100 the area of the inner region 111 is usually larger than the area of the edge region 112. Generally, it may be desirable to minimize the area of the edge region 112 relative to the overall area of the semiconductor body 100.

Referring to FIG. 1, the semiconductor device further includes a pn-junction 10 that extends in a lateral or horizontal plane in the inner region 111 of the semiconductor body 100. The pn-junction 10 is a junction between a first semiconductor region 11 of a first conductivity type (doping type) and a second semiconductor region 21 of a second conductivity type (doping type). According to one example the first semiconductor region 11 is a p-doped region and the second semiconductor region 21 is a n-doped region. According to another example the first semiconductor region 11 is an n-doped region and the second semiconductor region 21 is a p-doped region.

According to one example the semiconductor body 100 has a basic doping of the second conductivity type and with a doping concentration that equals to the doping concentration of the second semiconductor region 21. In this case, those regions of the semiconductor body that have the basic doping concentration form the second semiconductor region, while the other semiconductor regions, such as the first semiconductor region 11, are produced by implanting and/or diffusing dopants into the semiconductor body 100.

In the vertical direction of the semiconductor body 100 (the direction perpendicular to the first surface 101 and the second surface 102) the first semiconductor region 11 is arranged between the first surface 101 and the second semiconductor region 21. In the example illustrated in FIG. 1 the first semiconductor region 11 adjoins the first surface 111. However, this is only an example. According to another example (not shown in FIG. 1), the first semiconductor region 11 is arranged spaced apart from the first surface 101 in the vertical direction.

According to one example the second semiconductor region 21 is more lightly doped than the first semiconductor region 11. For example, the semiconductor body 100 is comprised of silicon, a doping concentration of the first semiconductor region 11 is selected from a range of between 1E16 cm$^{-3}$ (=1·10$^{16}$ cm$^{-3}$) and 1E21 cm$^{-3}$. The first semiconductor region can be produced by diffusing dopant atoms via the first surface 101 into the semiconductor body 100. In this case, the first semiconductor region has a maximum doping concentration in a region adjoining the first surface 101, wherein the doping concentration decreases towards the pn-junction 10. The doping concentration may decrease in accordance with the Gaussian distribution curve, and the maximum doping concentration may be selected from the range of between 1E16 cm$^{-3}$ and 1E21 cm$^{-3}$. For example, a doping concentration of the second semiconductor region 21 is selected from a range of between 1E12 cm$^{-3}$ and 5E14 cm$^{-3}$, in particular between 5E12 cm$^{-3}$ and 2E14 cm$^{-3}$. The doping concentration of the second semiconductor region 21 may be selected dependent on the desired voltage blocking capability of the semiconductor device, wherein the doping concentration decreases as the desired voltage blocking capability increases. For example, the doping concentration of the second semiconductor region 21 is 2E14 cm$^{-3}$ (which equals a resistivity of 30 Ωcm of the second semiconductor region 21) in a semiconductor device with a voltage blocking capability of 600V, and 5E12 cm$^{-3}$ (which equals a resistivity of 750 Ωcm of the second semiconductor region) in in a semiconductor device with a voltage blocking capability of 7500V (=7.5 kV).

In SiC, the critical electric field, which is the electric fields at which an Avalanche breakthrough may occur, is 10 times higher in SiC than in Si. Thus, the thickness d2 of an SiC based semiconductor device can be designed to be only 0.1 times the thickness of the corresponding Si device, and the doping concentrations of the individual device regions can be about 100 times the doping concentrations of the individual device regions explained above with respect to a Si based semiconductor device.

Referring to FIG. 1, the semiconductor device further includes an edge termination in the edge region 112. The edge termination includes at least one recess 30. The at least one recess extends from the first surface 101 in a vertical direction into the semiconductor body 100, and includes at least a first sidewall 31. In the example shown in FIG. 1 the recess 30 is spaced apart from the edge surface 103 and includes a second sidewall 32 opposite the first sidewall. In the following, this type of recess 30 is also referred to as trench. In the example shown in FIG. 1, the first sidewall 31 and the second sidewall 32 are essentially parallel so that the trench 30 furthermore includes a bottom 33, which is essentially perpendicular to the first sidewalls 31 and the second sidewall.

Implementing the trench 30 with parallel sidewalls 31, 32, however, is only an example. According to another example (not shown) the first sidewall 31 and the second sidewall 32 are tapered so that the trench 30 narrows in a direction facing away from the first surface 101. Such a trench with tapered sidewalls may have a bottom 33, or may not have a bottom. In the latter case, the first sidewall 31 and the second sidewall 32 converge at a position spaced away from the first surface 101 so that the trench 30 is a V-shaped trench.

In the following, a region of this semiconductor body 100 located between the edge surface 103 and the trench 30 is referred to as mesa region 121. The first sidewall 31 of the trench 30 is the sidewall that lies in the direction of the inner region 111, and the second sidewall 32 of the trench 30 is the sidewall that adjoins the mesa region 121.

According to one example both the first semiconductor region 11 and the second semiconductor region 21, in the lateral direction of the semiconductor body 100, extend to the first sidewall 31 of the trench 30, so that the pn-junction extends to the first sidewall 31. According to another example, illustrated in dashed lines in FIG. 1, a third semiconductor region 12 of the first conductivity type and more lightly doped than the first semiconductor region 11 is arranged between the second semiconductor region 21 and the trench 30. This third semiconductor region 12 may include a first section $12_1$ adjoining the first sidewall 31, a second section $12_2$ adjoining the second sidewall 32, and a third section $12_3$ adjoining the bottom 33. According to one example, the third section $12_3$ has a higher doping dose than the first section 121 and the second section 122. The "doping dose" of one of these first, second and third regions $12_1$, $12_2$, $12_3$ is the integral of the doping concentration in a direction perpendicular to the first sidewall 31, the second sidewall 32, and the bottom 33, respectively. For example, the doping dose of the third semiconductor region $12_3$ is selected to be below the breakthrough charge, which is about 1.4E12 q/cm$^2$ in silicon, wherein q is the elementary charge. According to one example, the second section 122 is optional and may be omitted. If the trench 30 is V-shaped there is no third section $12_3$. In this case, the first section $12_1$ takes over the functionality of the third section $12_3$.

The second semiconductor region 21, in the lateral direction of the semiconductor body 100, may extend into the edge region 112 and surrounds the trench 30. In the example shown in FIG. 1, major parts of the mesa region 121 are formed by the second semiconductor region 21. According to one example the semiconductor device includes a channel stopper region 22 of the second conductivity type in the mesa region 121. For example, the channel stopper region 22, in the lateral direction, extends from the second sidewall 32 of the trench 30 to the edge surface 103 and is more highly doped than the second semiconductor region 21. A depth of the channel stopper 22 region is, for example, selected from a range of between 5 μm and 10 μm. The "depth" is the dimension in the vertical direction. According to one example, a dopant dose of the channel stopper 22, which is the integral of the doping concentration in a direction perpendicular to the first surface 101, is higher than the breakthrough charge mentioned above. According to one example, the semiconductor body 100 is made of silicon and the dopant dose is higher than 2E12 cm$^{-2}$.

The at least one trench 30 does not completely extend through the semiconductor body 100 in the vertical direction and does not completely extend through the second semiconductor region 21. According to one example a maximum depth d1 of the trench 31 is less than 80%, in particular less than 66% or less than 50%, of a thickness d2 of the semiconductor body 100 in the vertical direction. For example, the maximum depth of the trench is greater than 30% of the thickness d2 of the semiconductor body 100.

According to a another example a maximum depth d1 of the trench 31 is less than 80%, in particular less than 66% or less than 50%, of a thickness of the second semiconductor region 21 in the vertical direction. For example, the maximum depth of the trench is greater than 30% of the thickness of the second semiconductor region 100. The second alternative is, in particular, applies to those cases in which the semiconductor body 100, besides a semiconductor layer in which the first and the second semiconductor regions 11, 21 are formed, includes a semiconductor substrate (not shown) on which this semiconductor layer is arranged and that is significantly thicker than this semiconductor layer. For example, such semiconductor layer is an epitaxial layer.

The doping concentration of the second semiconductor region 21 can be significantly lower than the doping concentration of the first semiconductor region 11. When the pn-junction 10 is reverse biased by applying a voltage between the first semiconductor region 11 and the second semiconductor region 21 a space charge region (depletion region mainly) expands in the second semiconductor region 21. In order to "stop" an electric field associated with this depletion region, the semiconductor device optionally includes a field-stop region 23 of the second conductivity type. The field stop region 23 adjoins the second semiconductor region 21 at that side that faces away from the first semiconductor region 11. The field-stop region 23 has a higher doping concentration than the second semiconductor region. The doping concentration of the field-stop region is, for example, in the range of between 1E14 cm$^{-3}$ and 1E16 cm$^{-3}$. A thickness (vertical dimension) of the field-stop region is, for example, in the range of between 10 micrometers (μm) to 20 micrometers and can be up to 50 micrometers.

Figure 2:
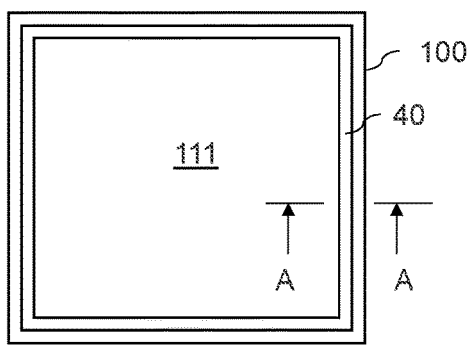
FIG. 2 shows a top view of a semiconductor device according to one example.

FIG. 2 schematically illustrates a top view on the first surface 101 of the semiconductor body 100. In this example, the semiconductor body 100 is rectangular, in particular square, in shape. The at least one trench 30 may extend along the complete edge surface 103, so that the at least one trench 31 completely surrounds the inner region. A rectangular semiconductor body 100, however, is only an example. A semiconductor body with any other shape such as a circular shape, or a polygonal shape may be used as well. The cross section illustrated in FIG. 1 is a cross section in a section plane A-A illustrated in FIG. 2. This section plane A-A is perpendicular to a longitudinal direction of the trench 31.

The trench 30 and the mesa region 121 between the trench 30 and the edge surface 103 form an edge termination of the semiconductor device. This edge termination, in space saving manner, helps to keep the electric field strength in the edge region 112 of the semiconductor body 100 below a predefined value when the pn-junction is reversed and a depletion region extends in the second semiconductor region 21. The pn-junction can be reverse biased by applying a suitable voltage between the first semiconductor region 11 and the second semiconductor regions 21. This voltage that reverse biases the pn-junction is such that the first semiconductor region 11 is negative relative to the electrical potential of the second semiconductor region 21 when the first semiconductor region 11 is p-doped and the second semiconductor region 21 is n-doped, and such that the first semiconductor region 11 is positive relative to the second semiconductor region when the first semiconductor region 11 is n-doped and the second semiconductor region 21 is p-doped. The electrical potential of the mesa region 121 essentially equals the electrical potential that is applied to the second semiconductor region 21 when reverse biasing the pn-junction.

When the pn-junction 10 is reverse biased equipotential lines of an electric field associated with the depletion region extend essentially horizontally in the inner region 111 of the semiconductor body. These equipotential lines enter the trench 30 and leave the trench 30 at the first surface. This is explained in greater detail below with reference to an example shown in FIG. 8. In the electric field, an absolute value of the electric field strength reaches a maximum in the trench 30, which is filled with a dielectric 40.

Figure 3:
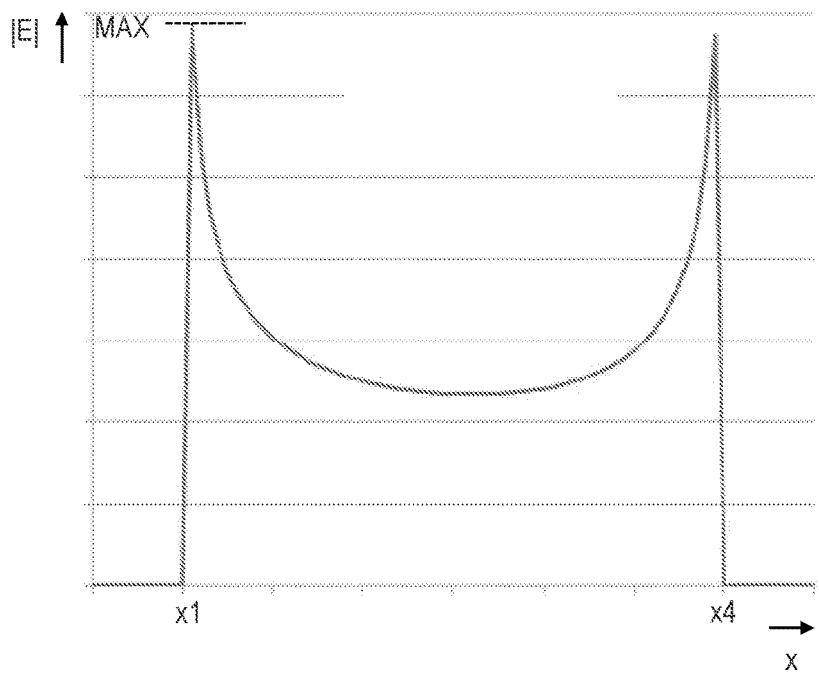
FIG. 3 shows a curve illustrating the absolute value of an electric field in the edge region of a conventional semiconductor device.

FIG. 3 illustrates the absolute value of the electric field strength occurring in the trench 30 if the trench is filled with a homogenous dielectric 40. "Homogenous" means that a relative number $\in$ of the dielectric is essentially the same everywhere in the dielectric 40. The "relative dielectric number" is simply referred to as "dielectric number" in the following. As can be seen from FIG. 3, the absolute value |E| of the electric field strength in the trench 30 has a first maximum at a first lateral position x1, which is the position of the first sidewall 31, and a second maximum at a second lateral position, which is the position of the second sidewall 32. The absolute values of the first maximum and the second maximum are essentially equal in this example. These absolute values are dependent on several parameters, such as the absolute value of the voltage reverse biasing the pn-junction 10, the dielectric number of the dielectric 40, the depth and a width of the trench 30. The "width" of the trench 30 is the dimension of the trench in the lateral direction x shown in FIG. 1.

In a semiconductor device with a voltage blocking capability of 1 kilovolt (kV) or more the absolute value of the electric field strength can reach 1 MV/cm or more. Commercially available dielectrics such as benzocyclobutene (BCB) containing dielectrics have a dielectric strengths of several MV/cm For example, BCB containing "Cyclotene™ 3000" available from Dow Chemicals has a dielectric strength of 5.3 MV/cm and a leakage current of 0.68 nA/cm² at 1 MV/cm. The leakage current in these types of dielectrics, however, increases as the absolute value of the electric field strength increases. It may therefore be desirable to operate those dielectrics at electric field strengths far below their dielectric strengths.

In order to reduce the maximum absolute value of the electric field strength occurring in the trench 30 of the edge termination structure shown in FIG. 1, the dielectric 40 filling the trench includes a varying dielectric number such that the dielectric number, in the lateral direction, decreases as a distance from the first sidewall 31 increases. In the example shown in FIG. 1, where the recess (trench) 30 includes two opposing sidewalls 31, 32, the dielectric number decreases, in the lateral direction x, towards a center of the recess 30 as the distance from each of the first sidewall 31 and the second sidewall 32 increases. The "center" of the recess 30, in the lateral direction x, is in the middle between the first sidewall 31 and the second sidewall 32.

In the example shown in FIG. 1, a decrease of the dielectric number in the dielectric 40 is obtained by the dielectric 40 including a first dielectric layer 41 having a first dielectric number $\in 1$, and a second dielectric layer 42 having a second dielectric number $\in 2$ lower than the first dielectric number $\in 1$. In this example, the first dielectric layer 41 covers the first sidewall 31, the second sidewall 32, and the bottom 33. The second dielectric layer 42 adjoins the first dielectric layer 41 and fills the trench 30. Optionally, the second dielectric layer 42 covers those sections of the first surface 101 that adjoin the recess 30. Furthermore, the second dielectric layer 42 may cover the edge surface 103. The second dielectric layer 42 covering sections of the first surface 101 and the edge surface 103 is illustrated in dashed lines in FIG. 1.

Figure 4:
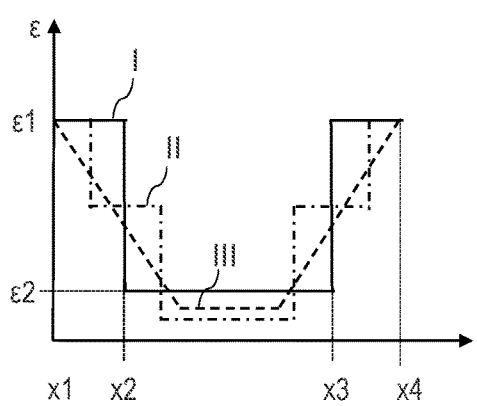
FIG. 4 shows curves illustrating the dielectric number of a dielectric layer filling a trench in the edge region of a semiconductor device of the type shown in FIG. 1.

In FIG. 4, curve I illustrates the dielectric number $\in$ of the dielectric 40 along a line that extends in the lateral direction x and goes through the first dielectric layer 41 and the second dielectric layer 42 in a region wherein the second layer 42 adjoins the first layer 41 in the lateral direction x. In FIG. 4, x2 denotes the position of a first interface between the first dielectric layer 41 and the second dielectric layer 42, and x3 denotes the position of a second interface between the first dielectric layer 41 and the second dielectric layer 42. As can be seen, the first dielectric number $\in 1$ is higher than the second dielectric number $\in 2$. For example, the first dielectric number $\in 1$ is selected from a range of between 10 and 30, and the second dielectric number $\in 2$ is selected from a range of between 1 and 5.

Figure 5:
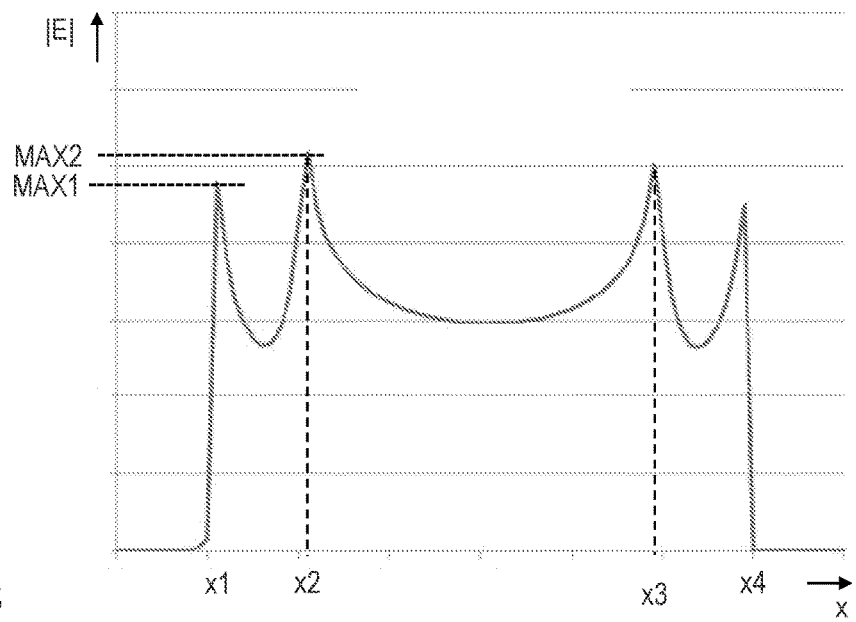
FIG. 5 shows a curve illustrating the absolute value of an electric field in the edge region of a semiconductor device of the type shown in FIG. 1, if the dielectric layer includes two sub-layers.

FIG. 5 illustrates the absolute value of the electric field strength occurring in the trench 30 if the dielectric 40 is implemented as shown in FIG. 1 and curve I of FIG. 4, respectively. Referring to FIG. 5, the absolute value of the electric field strength includes four maxima. A first maximum is at the first sidewall (lateral position x1) at an interface between the semiconductor body 100 and the first dielectric layer 41. A second maximum is at the second sidewall (lateral position x4) at another interface between the semiconductor body 100 and the first dielectric layer 41. A third maximum is at a position x2 at an interface between the first dielectric layer 41 and the second dielectric layer 42, and a fourth third maximum is at a position x3 at another interface between the first dielectric layer 41 and the second dielectric layer 42. Levels of the first maximum and the second maximum are essentially equal Each of these first to fourth maxima is lower than the maxima observed in a comparable device being different only in that the recess 30 is filled with a homogenous dielectric 40 instead with a dielectric with laterally decreasing dielectric number.

The benefit of having an edge termination structure as shown in FIG. 1 as compared to a conventional edge termination structure with a homogenous dielectric will become apparent from two example semiconductor devices that are only different in the edge termination structure. Example device A includes a conventional edge termination structure with a homogenous dielectric so that the absolute value of the electric field strength is represented by the curve shown in FIG. 3, and Example device B includes an edge termination structure with two layers 41, 42 as shown in FIG. 1 so that the absolute value of the electric field strength is represented by the curve shown in FIG. 5.

In both example devices A and B, the device parameters are as follows: the second device region 21 is n-doped and has a resistivity of 53 Ωcm, which essentially equals a doping concentration of 8.1E13 cm$^{-3}$; a thickness d1 of the semiconductor body 100 is 125 micrometers (μm); the first semiconductor region 11 is p-doped has a maximum doping concentration of 1E17 cm$^{-3}$ (at the first surface 101), and extends 6 micrometers into the semiconductor body 100; the channel stopper region 22 is n-doped, has a maximum doping concentration of 1E18 cm$^{-3}$, and extends 6 micrometers into the semiconductor body 100; the field-stop region 23 is n-doped, has a maximum doping concentration of 1.3E14 cm$^{-3}$ and is 10 micrometers wide in the vertical direction; an emitter region (not shown in FIG. 1) adjoining the field-stop region 23 is n-doped, has a maximum doping concentration of 3.5E15 cm$^{-3}$, and is 2 micrometers wide in the vertical direction; the first section 121 and the second section 122 of the (p-doped) third semiconductor region 12 each have a dopant dose of 6E11 cm$^{-2}$, and the third section 12$_3$ has a dopant dose of 1.4E12 cm$^{-2}$; and the recess 30 completely surrounds the inner region 111, is 60 micrometers wide in the lateral direction x, and 70 micrometers deep.

In the example device A, the dielectric number of the homogenous dielectric is 2.7. This device has a rated voltage of 1200V and a voltage blocking capability of 1832V. When a voltage equal the voltage blocking capability is applied to the pn-junction maximum absolute value of the electric field strength in the dielectric is 0.7 MV/cm. This corresponds to the maximum MAX shown in FIG. 3.

In the example device B, the first dielectric number ∈1=15, the second dielectric number ∈2=2.7, and a thickness of the first dielectric layer 41, which is the dimension vertical to the first and second sidewalls 31, 32 is 10 micrometers. The rated voltage is 1200V and the voltage blocking capability is 1820V, which is slightly (about 0.7%) less than the voltage blocking capability of example device A. A maximum absolute value of the electric field strength in the dielectric 40, however, is 0.5 MV/cm, which is significantly (28.6%) less than in the example device. Thus, implementing the dielectric to have a decreasing dielectric number in the lateral direction x helps to reduce the absolute value of the electric field strength in the dielectric 40 as compared to a device with a homogenous dielectric.

Simulations show that in the conventional device the maximum absolute value of the electric field strength occurs in the dielectric 40 at the first sidewall 31 and the second sidewall 32, if there is any, and in the region of the first surface 101. Implementing the dielectric 40 with a varying dielectric number, in particular in a region along the first surface 101, helps to make the electric field in this region more homogenous and, therefore, helps reduce the maximum of the electric field strength. Selecting the number of dielectric layers with different dielectric numbers and selecting the dielectric numbers of the respective layers can be based on considerations explained in the following.

Referring to FIG. 3, in a trench with a homogenous dielectric 40 the absolute value of the electric field has maxima at the trench sidewalls (at positions x1 and x4) and decreases towards a center of the trench. Thus, a gradient of the electric field is different from zero, while a gradient of the constant dielectric number is zero. If on the other hand the dielectric number of the dielectric 40 would be varied in the lateral direction x to have a gradient corresponding to the gradient of the electric field in a device with a homogenous dielectric the resulting electric field would be essentially constant, that is, the gradient would be zero. Mathematically, this relationship can be expressed as follows:

$$E_x \cdot \frac{\partial \varepsilon(x)}{\partial x} = -\varepsilon \cdot \frac{\partial E_x(x)}{\partial x}, \qquad (1)$$

where ∈(x) denotes the varying dielectric number, ∂∈(x)/∂x denotes the gradient of this dielectric number, and $E_x$ denotes the (constant) field component of the electric field in the lateral direction x, ∈ denotes the dielectric number of the homogenous dielectric, and ∂$E_x$(x)/∂x denotes the gradient of the varying lateral field component of the electric field. The electric field $\vec{E}$ is given by $$\vec{E} = \begin{pmatrix} E_x \\ E_y \\ E_z \end{pmatrix}, \qquad (2)$$

where $E_x$ is the field component in the lateral direction, $E_y$ is the field component in the vertical direction y (see FIG. 1) perpendicular to the first surface 101, and the $E_z$ is the field component in a further lateral direction perpendicular to the lateral direction x and y. An absolute value |E| of the electric field $\vec{E}$ is then given by $$|E| = \sqrt{E_x^2 + E_y^2 + E_z^2} \qquad (3).$$

Equation (1) is based on the more general equation $$\text{div } \vec{\varepsilon} \cdot \vec{E} = 0 \qquad (4),$$

where $\vec{\varepsilon}$ is the tensor representing the dielectric number (which varies in x direction and is constant in y direction) and $\vec{E}$ is the electric field (more precisely, the vector of the electric field strength) The assumption that gradients $$\frac{\partial E_y}{\partial y} \text{ and } \frac{\partial E_z}{\partial z}$$

of the vertical field component $E_y$ and the lateral field component $E_z$ of the electric field are zero in order to achieve the homogenous electric field in the dielectric 40 leads to equation (1).

Summarizing the above, based on the variation of the electric field component $E_x$(x) in a device with homogenous dielectric a variation of the dielectric number ∈(x) in a desired device with homogenous electric field $E_x$ can be obtained. While equation (1) can be used to calculate a desired variation, that is, the gradient ∂∈(x)/∂x in the dielectric number ∈(x), the absolute value of the dielectric number ∈(x) is calculated in consideration of certain constraints.

According to one example, a first constraint is that the absolute value of the electric field in the semiconductor body 100 should not exceed the critical electrical field $E_{BR}$. For example, in silicon the critical electrical field is 2E5 V/cm. A second constraint may be that in the semiconductor body 100 in a region adjoining the first sidewall 31 and the first surface 101 the lateral field component Ex and the vertical field component are essentially equal, that is $E_{x,SE}=E_{y,SE}$, where $E_{x,SE}$ is the lateral field component of the electric field and $E_{y,SE}$ is the vertical field component of the electric field in the semiconductor body. For the purpose of explanation it is further assumed that the first semiconductor region 11 and trench 30 are elongated in the lateral direction z, which is the direction perpendicular to the lateral direction y, so that the lateral field component $E_z$ is zero in the semiconductor body 100 and the trench 30. Based on the first constraint, the second constraint and this assumption the following applies:

$$|E(x1)| < E_{BR} => \sqrt{E_{x,SE}^2(x1) + E_{y,SE}^2(x1)} < E_{BR} => E_{x,SE} < \frac{E_{BR}}{\sqrt{2}}, \quad (5)$$

where |E(x1)| denotes the absolute value of the electric field in the semiconductor body 100 at the first sidewall (which is at lateral position x1), $E_{x,SE}(x1)$ and $E_{y,SE}(x1)$ denote the lateral and horizontal field components at the first sidewall 31, and $E_{BR}$ denotes the critical electrical field strength.

The maximum electric field strength when the semiconductor device is reverse biased occurs at the pn junction 10 between the first semiconductor region 11 and the second semiconductor region 21. This pn junction 10 essentially extends in a horizontal plane that is parallel to the first surface 101. The pn junction 10 may adjoin the trench. In this case there is position at the first sidewall 31 where the maximum electric field occurs. If the semiconductor device includes the doped region 12 explained with reference to FIG. 1 the pn junction 10 between the first region 11 and the second region 21 is spaced apart from first sidewall 121 by the first section 121 of the doped region. The region 121, which is higher doped than the second region 21, has the effect that the maximum electric field strength at the first sidewall $12_1$ is lower than the maximum electric field strength at the pn junction 10. This is explained in further detail below with reference to FIG. 9.

A third constraint is based on the fact that at the interface between the semiconductor body 100 and the dielectric 40 the following applies (because the normal component of the dielectric displacement field is continuous):

$$\in_{SE} \cdot E_{x,SE} = \in(X1) \cdot E_x(x1) \quad (6a)$$

$$E_{y,SE} = E_y(x1) \quad (6b),$$

where $\in_{SE}$ is the dielectric number of the material of the semiconductor body 100; $E_{x,SE}$ is the absolute value of lateral component $E_x$ and $E_{y,SE}$ is the absolute value of the vertical component of the electric field in the semiconductor body 100 at the interface between the semiconductor body 100 and the dielectric 40, that is, at the first sidewall 31 and the second sidewall, if there is any; and (x1) is the dielectric number of the dielectric 40 at the interface between the semiconductor body 100 and the recess 30. In particular, $E_{x,SE}$ represents the electric field strength at the interface at a position close to the first surface 101, where the maximum of the electric field along the trench 30 occurs. If the electric field in the dielectric 40 is homogenous, as desired, the following applies:

$$E_x = \frac{U}{w}, \quad (7)$$

where U denotes the maximum voltage across the recess 30 in the lateral direction x, and w denotes the width of the recess, which is the dimension of the recess in the lateral direction x. When the semiconductor device is reverse biased, the first semiconductor region 11 has a first electrical potential and an emitter region (not shown in FIG. 1) adjoining the second emitter region 21 or the field stop region 23 has a second electrical potential different from the first electrical potential. The difference between these electrical potentials is the voltage that reverse biases the pn-junction (the semiconductor device). In the reverse biased state, the electrical potential in the mesa region 121 or the channel stopper region 22 essentially equals the second electrical potential so that the voltage U across the dielectric 40 in a region close to the first surface 101 essentially equals the voltage that reverse biases the semiconductor device.

Based on equations (5)-(7) the dielectric number $\in(x1)$ of the dielectric 40 at the first sidewall can be calculated. It should be noted that the dielectric number obtained from these equations is the minimum dielectric number that is required at the first sidewall 31. This minimum dielectric number will be referred to as $\in_{min}$ in the following. If, for example, a semiconductor device with a reduced (more homogenous) electric field is to be designed based on the example device A the minimum dielectric number $\in_{min}$ can be calculated based on equations (6) and (7) by taking into account that the voltage blocking capability of example device A is 1832V and the recess width is 60 micrometers. Thus, in case of a homogenous electric field in the dielectric, the lateral field component $E_x$ in the dielectric on equation (7) is $E_X$=3.0E5 V/cm (=1832V/60 μm). Using Ex and the dielectric number $\in_{SE}$ of the semiconductor material (which is 11.9 in silicon) the minimum dielectric number $\in_{min}$ that is required at the first sidewall is 5.5.

According to a further constraint, the average of the dielectric number $\in(x)$ in the lateral direction x is higher than the minimum dielectric number $\in_{min}$ that is:

$$\frac{1}{d} \cdot \int_{x1}^{x4} \varepsilon(x) \, dx \geq \varepsilon_{min}. \quad (8)$$

Figure 6:
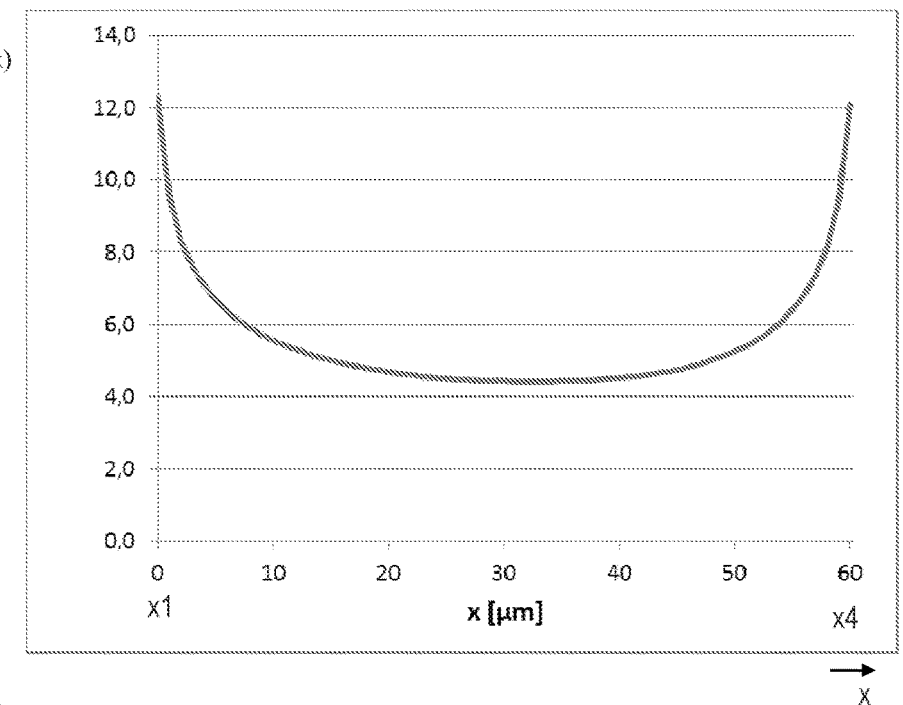
FIG. 6 shows a curve illustrating the dielectric number in a semiconductor device having a homogenous electric field in the trench.

Based on these constraints and based on the variation of the electric field in a device with homogenous a dielectric, such as example device A, a variation of the dielectric number can be calculated such that the electric field is substantially homogenous. FIG. 6 shows the calculated dielectric number $\in(x)$ in a semiconductor device that is based on example device A, but has a varying dielectric in order to obtain a homogenous electric field in the dielectric 40. In this example, the dielectric number $\in(x1)$ at the first sidewall x1 (and $\in(x4)$ at the second sidewall is about 12.3 and a gradient $\partial\in(x)/\partial x$ at the first sidewall is about -2.7 μm$^{-1}$.

In the following, a dielectric with a varying dielectric number that results in a homogenous electric field is referred to as ideal dielectric. As it is difficult to implement the ideal dielectric, that is, to implement the dielectric 40 in accordance with a curve of the type shown in FIG. 6 the dielectric 40 can be produced with two or more essentially homogenous layers (such as layers 41, 42 shown in FIG. 1) that approximates a dielectric with a dielectric number as shown in FIG. 6. In this case, as shown in FIG. 5, the electric field is not exactly homogenous in the dielectric 40 but the maxima of the electric field strength are significantly reduced as compared to a device with a homogenous dielectric. When approximating the ideal dielectric by providing two or more dielectric layers in the dielectric 40 the same constraints as explained above apply, that is, in particular, the average dielectric number should be equal to or higher than the minimum dielectric number $\in_{min}$.

Suitable materials to form the dielectric 40 include, but are not restricted to, BCB; BCB including $BaTiO_2$ as additive; high-k glasses such as barium-neodymium-titanium-borate glass, which may include $Al_2O_3$ and/or $BaTiO_3$ as additives; high-k polymers; PVD (Plasma Vapor Deposited), PEVD (Plasma Enhanced Vapor Deposited) or epitaxially deposited high-k layers, or the like. In these types of the dielectrics the dielectric number can be varied by varying the amount of additives, for example.

Of course, the dielectric 40 is not restricted to include only two layers 41, 42 having different dielectric numbers. Basically, dielectric 40 may include any plurality of layers arranged such that dielectric numbers decreases as a distance at least from the first sidewall 31 increases. Curve II shown in FIG. 4 illustrates an example, where the dielectric 40 includes three layers with different dielectric numbers. It is even possible to implement the dielectric 40 such that the dielectric number in one layer decreases essentially continuously as the distance at least to the first sidewall 31 increases. Curve III shown in FIG. 4 illustrates an example where the dielectric includes a first layer with a continuously decreasing dielectric, and a second layer with an essentially homogenous dielectric number in the center of the recess 30.

Figure 7:
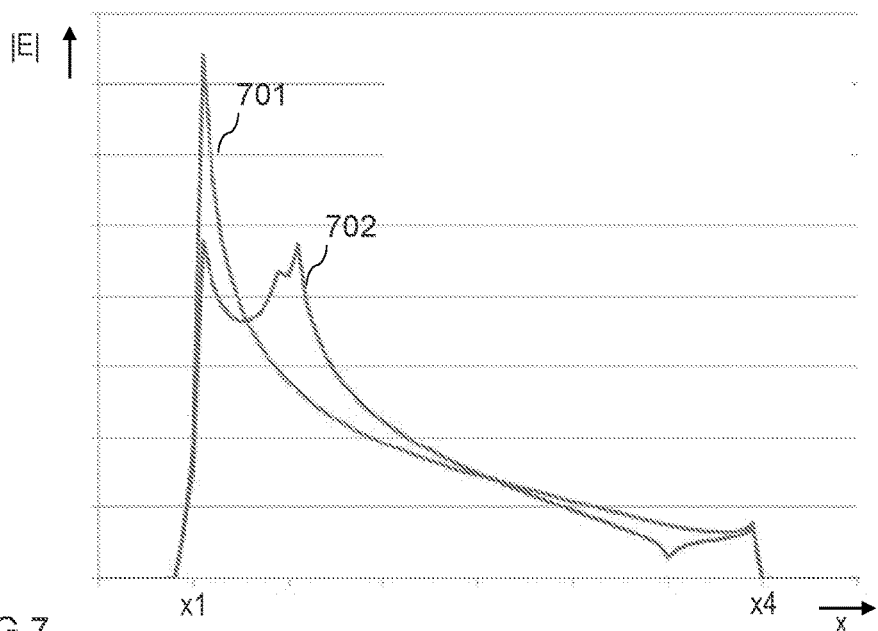
FIG. 7 shows a curve illustrating the absolute value of an electric field in the edge region of a semiconductor device of the type shown in FIG. 1, if there are external charges that affect the electric field.

Due to parasitic effects charges can be incorporated into the dielectric or a passivation layer above the trench 30. In FIG. 7 curve 701 shows the electric field in example device A and curve 702 shows the electric field in example device B if there are such additional charges in the dielectric or passivation layer. Just for the purpose of illustration these curves 701, 702 are based on a simulation that simulated a surface charge of +8E11 q/cm², where q is the elementary charge, at a distance of 10 micrometers from the first surface 101 and above the trench 30. As can be seen from FIG. 7, these charges increase the electric field strength in the region of the first sidewall 31 and decrease the electric field strength in the region of the second sidewall 32 in both devices, wherein the maxima in the device with the two different dielectric layers (see curve 702) are lower than in the device with the homogenous dielectric (see curve 701). Thus, the presence of two or more different dielectric layers is also effective if there are parasitic charges.

Figure 8:
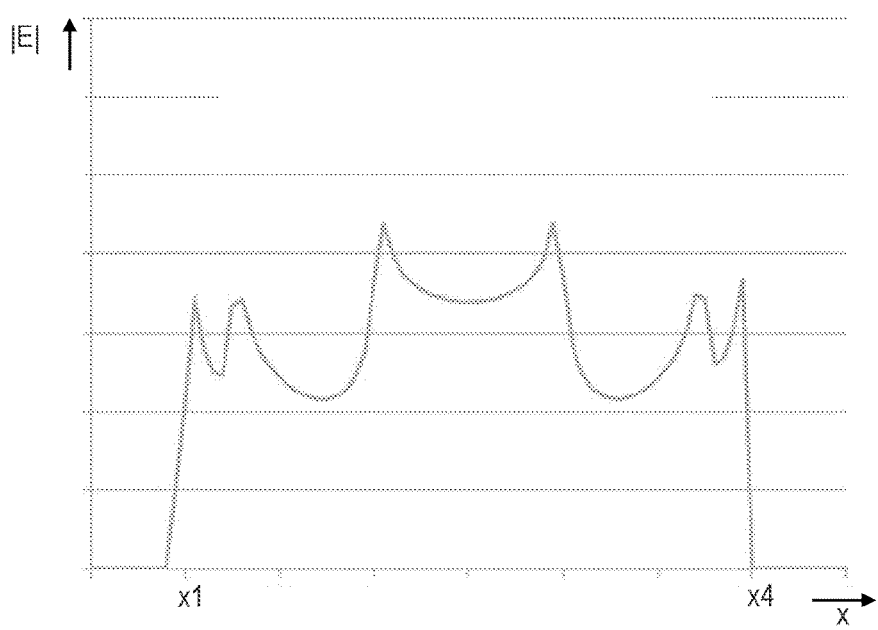
FIG. 8 shows a curve illustrating the absolute value of an electric field in the edge region of a semiconductor device of the type shown in FIG. 1, if the dielectric layer includes three sub-layers.

FIG. 8 illustrates the absolute value of the electric field in a semiconductor device that includes a dielectric with a dielectric number as illustrated in curve II shown in FIG. 4. That is, the dielectric 40 includes three substantially homogenous layers with different dielectric numbers. Referring to FIG. 7, the field strength includes six maxima, two at the first and second sidewalls (lateral positions x1, x4 in FIG. 7), and four at interfaces between the individual dielectric layers. The highest one of these maxima, however, is lower than highest maximum in a device with only two dielectric layers. This is explained with reference to an example device C that is different from the example devices A and B only in that it includes three dielectric layers, namely a first dielectric layer with $\in 1=30$ and a thickness of 5 micrometers on the sidewalls 31, 32 and the bottom 33, a second dielectric layer with $\in 1=30$ and a thickness of 15 micrometers on the first dielectric layer, and a third dielectric layer with $\in 3=2.7$ on the second layer that fills the recess and is also arranged on the first surface. Based on simulations, the highest maximum of the absolute value of the electric field strength is 0.3 MV/cm, which is 20% less than in the example device B. The voltage blocking capability of this example device C is 1590V, which is about 13% less than in the example device B.

In general, as can be seen from equation (1) the more continuously the dielectric number decreases the more homogenous the electric field in the dielectric becomes.

Figure 9:
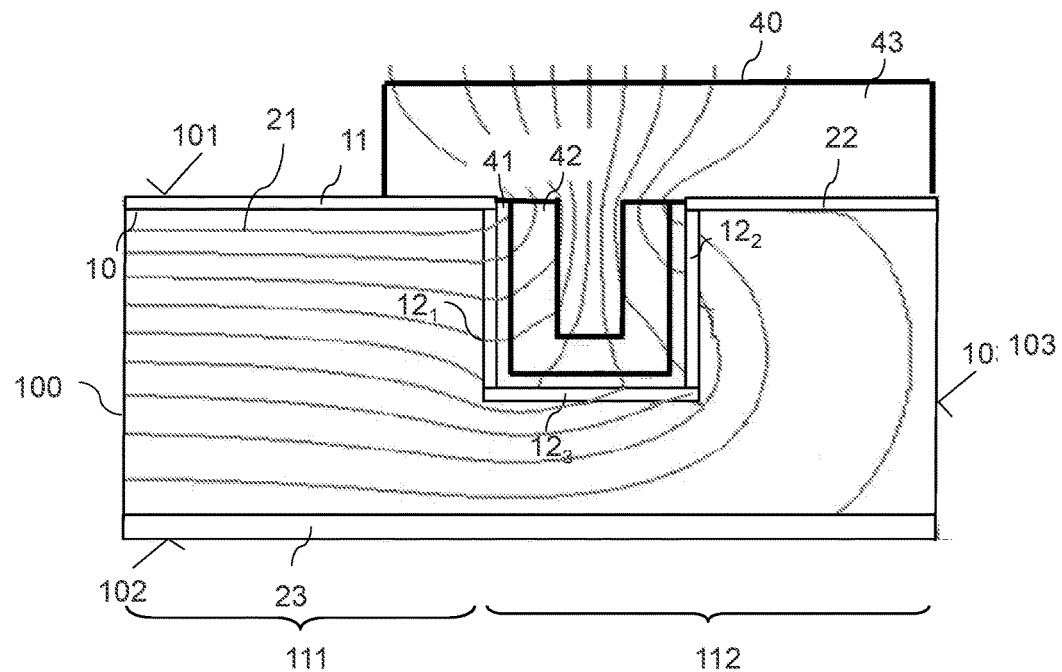
FIG. 9 illustrates equipotential lines in an edge region of a semiconductor device of the type shown in FIG. 1 when a pn-junction of the semiconductor device is reverse biased.

FIG. 9 illustrates equipotential lines of an electric field occurring in a reverse biased semiconductor device with three different dielectric layers 41, 42, 43 in the dielectric 40. The illustration in FIG. 9 is based on simulating the operation of example device C explained above. Referring to FIG. 9 the equipotential lines extend substantially horizontally in the inner region 111 of the semiconductor body. The equipotential lines leave the semiconductor body 100 in the recess 30. Referring to FIG. 9, the electric field does not extend or does not significantly extend into the mesa region 121 and the channel stopper region 22 so that the mesa region 121 and the channel stopper region 22 are free of an electric field when the pn-junction 10 is reverse biased. In general, the shorter the distance is between two adjacent equipotential lines, the higher is the field strength. As can be seen from FIG. 8, the highest electric field strengths occur in the dielectric 40 along the surface 101. This is in accordance with what was explained above. In the device shown in FIG. 9, the shortest distances between adjacent equipotential lines, that is, the highest field strengths occur near the center of the trench, which is in accordance with the curve shown in FIG. 8. Furthermore, as can be seen from FIG. 9, the doped region 12, in particular the first section 121 of the doped region 12, "spreads the equipotential lines", which is equivalent to a reduction of the electric field. Thus, the doped region $12_1$ causes the maximum electric field at the first sidewall 31 to be lower than in the second region 21.

Basically, the field strengths in the recess 30 can be further reduced by increasing the average dielectric number in the dielectric 40, The average dielectric number is the average of the dielectric number along a line in the lateral direction. An increase of the average dielectric number, however, decreases the voltage blocking capability. This can be seen from example devices A, B, and C. In example device A, the average dielectric number $\in_{AVG}$ is $\in_{AVG}=2.7$ and the voltage blocking capability is 1832V; in example device B, the average dielectric number $\in_{AVG}$ is $\in_{AVG}=6.8$ and the voltage blocking capability is 1820V; and in example device C, the average dielectric number $\in_{AVG}$ is $\in_{AVG}=10.8$ and the voltage blocking capability is 1590V. Thus, according to one example, the maximum dielectric number in the dielectric is not higher than 30. According to one example, the maximum dielectric number in the dielectric 40 is selected from a range of between 10 and 30.

Figure 10:
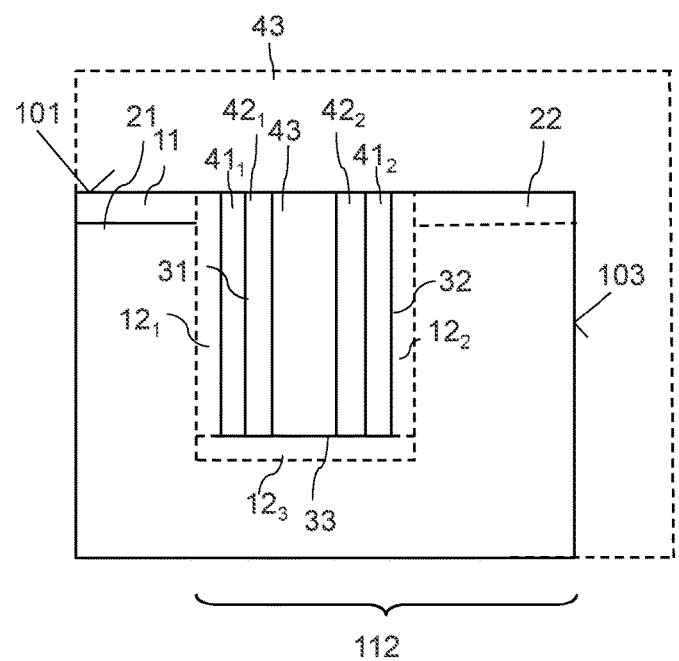
FIG. 10 shows an edge region of a semiconductor device according to another example.

FIG. 10 shows a modification of the edge termination structure explained before. In the examples explained before, the different layers of the dielectric 40 form a layer stack on the sidewalls 31, 32 and the bottom 33. In the example shown in FIG. 10, layer stacks are formed only on the sidewalls 31, 32 such that these layers are substantially perpendicular to the bottom 33. In this example, where the recess includes opposing sidewalls 31, 32 layers $41_1$, $41_2$ have essentially equal dielectric numbers, and layers $42_1$, $42_2$ covering layers $41_1$, $41_2$ have essentially equal dielectric numbers. Another layer 43 fills the recess and is arranged on the first surface 101. In this structure, layers $41_1$, $41_2$ correspond to the first layer 41 explained above, and layers 42₁, 42₂ correspond to the first layer 42 explained above.

Figure 11:
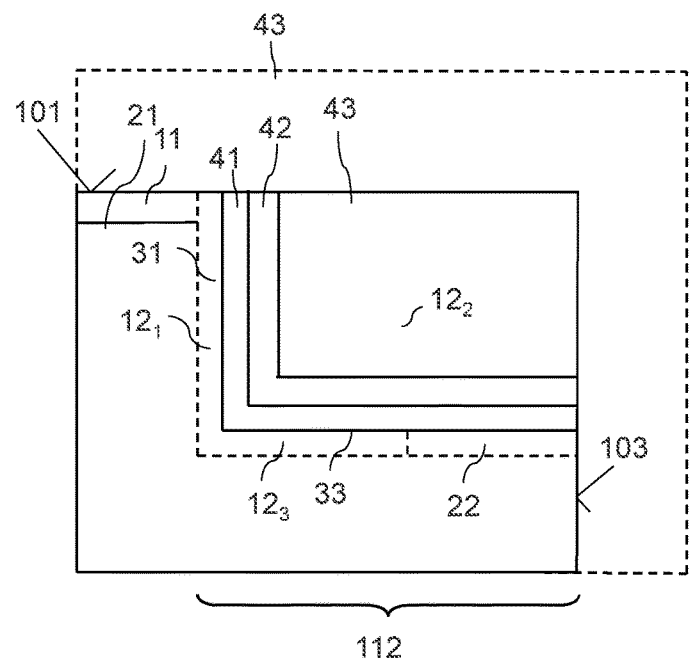
FIG. 11 shows an edge region of a semiconductor device according to another example.

FIG. 11 shows another modification of the edge termination structure. In this example, the recess, in the lateral direction x, extends to the edge surface 103 so that the recess includes only one sidewall, namely the first sidewall 31. In this example, the channel stopper region 22 is arranged below the bottom of trench and, in the lateral direction x, between the sidewall 103 and the third section 12₃ of the third semiconductor region 12.

The edge termination structure explained above can be implemented in a plurality of different semiconductor devices including a pn junction. In the following examples of some devices that have a basic structure as shown in FIG. 1 are explained below.

Figure 12:
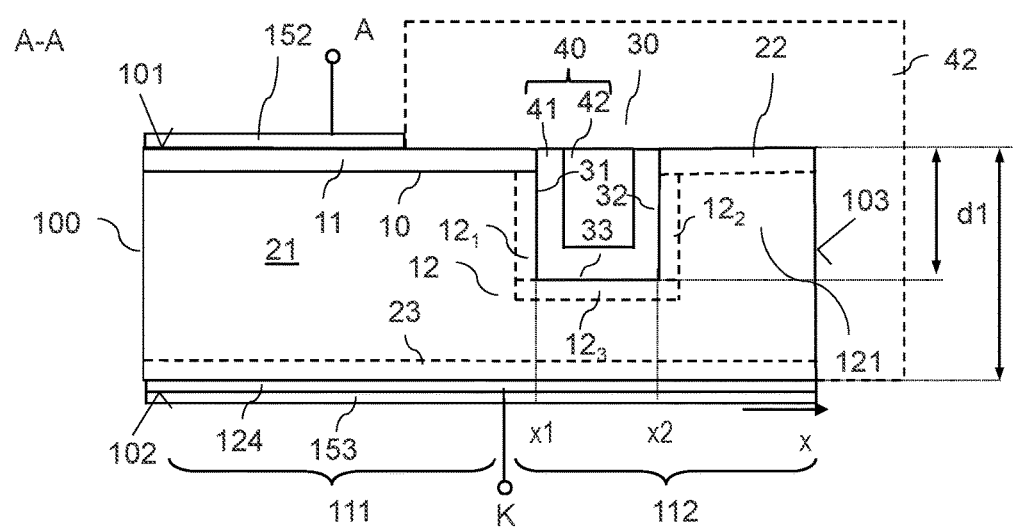
FIG. 12 shows a vertical cross sectional view of a section of a semiconductor device implemented as a bipolar diode.

FIG. 12 illustrates an example of a vertical semiconductor device implemented as a diode. In this semiconductor device the first semiconductor region 11 forms a first emitter, such as a p-type emitter, of the diode, and the second semiconductor region 21 forms a base region, such as an n-type base. The diode further includes a second emitter region 124 of the second conductivity type and more highly doped than the base region 21. The base region 21 is arranged between the first and the second emitter regions 11, 124. The optional field-stop region 23 is arranged between the base region 21 and the second emitter region 124.

The first emitter region 11 is contacted by a first electrode 152, and the second emitter region 124 is contacted by a second electrode 153. When the first emitter region 11 is p-doped, the first electrode 152 forms an anode A and the second electrode 153 forms a cathode K of the diode.

Figure 13:
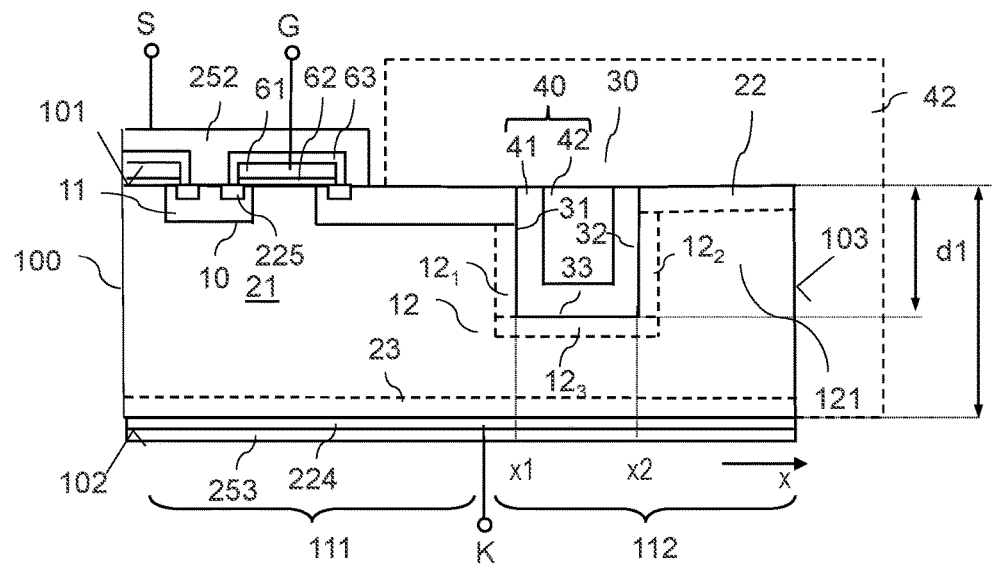
FIG. 13 shows a vertical cross sectional view of a section of a semiconductor device implemented as a MOSFET.

FIG. 13 illustrates a vertical semiconductor device implemented as a MOS transistor. In this device a first semiconductor region 11 forms a body region and the second semiconductor region 21 forms a drift region. In an n-type MOS transistor the body region 11 is p-doped and drift region 21 is n-doped, and in a p-type MOS transistor the body region 11 is n-doped and the drift region 21 is p-doped. The MOS transistor further includes at least one source region 225 of the second conductivity type that is separated from the drift region 21 by the body region 11. A gate control structure with a gate electrode 61 and a gate dielectric 62 is arranged adjacent to the body region 11 and extends from the source region 225 to a section of the drift region 21. In the example illustrated in FIG. 12 the gate electrode 61 is a planar electrode that is arranged above the first surface 101. However, this is only an example, other types of gate electrodes, such as trench electrodes may be applied as well. The MOS transistor may include a cell-like structure with a plurality of identical structures each including a source region 225 and a gate electrode 61 or a section of a gate electrode.

The MOS transistor further includes a drain region 224 of the second conductivity type which is more highly doped than the drift region 21. Drift region 21 is arranged between the body region 11 and the drain region 224. Optional field stop region 23 is arranged between the drift region 21 and the drain region 224.

The MOS transistor can be implemented as a MOSFET or an IGBT. In a MOSFET the drain region 224 is of the same doping type as drift region 21. In an IGBT the drain region 224 is doped complementarily to the drift region 21. This drain region 224 is also referred to as emitter region in an IGBT. In case of an IGBT the drain region 224 can include bypasses (not shown) at which the drift region 21 can contact the drain electrode. These bypasses are also known as drain or emitter shorts. In this way a reverse conducting (RC) IGBT is obtained. This is an IGBT can block voltages only in the forward direction, i.e. when applying a positive voltage between drain D and source S.

The MOS transistor further includes a first electrode 252 that acts as a source electrode and contacts source regions 225 and body region 11, and a second electrode 253 that acts as a drain electrode and contacts the drain region 225.

Figure 14:
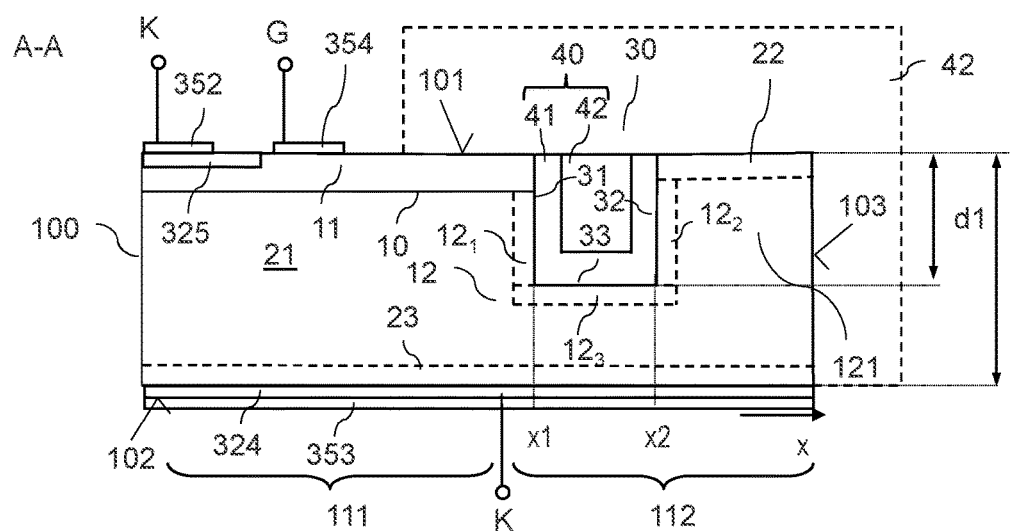
FIG. 14 shows a vertical cross sectional view of a section of a semiconductor device implemented as a thyristor.

FIG. 14 illustrates a vertical cross section through a semiconductor device implemented as a thyristor. In this thyristor the first semiconductor region 11 forms a first base region, such as a p-base, of the thyristor, the second semiconductor region 21 forms a second base region, such as an n-base of the thyristor. The first base region 11 is contacted by a control electrode 354. The device further includes a first emitter region 325 of the second conductivity type that is contacted by a first electrode 352, and a second emitter region 324 of the first conductivity type and contacted by a second electrode 353. The first base region 11 is arranged between the first emitter region 25 and the second base region 21, and the second base region 21 is arranged between the first base region 11 and the second emitter region 324. In this device the first electrode 352 forms a cathode terminal, the second electrode 353 forms an anode terminal, and the control electrode forms a gate terminal.

Although the example devices explained above include a silicon semiconductor body 100 the concept of reducing the field strength in the trench 30 by providing a dielectric with a laterally varying dielectric number is not restricted to those silicon based semiconductor devices. This concept may be used in a semiconductor device based on a semiconductor material different from silicon, such as silicon carbide (SiC), as well. In silicon carbide, the critical electric field strength is about 10 times the critical electric field strength in silicon. Basically, a SiC device can be implemented with the same type of dielectric and the same lateral profile of the dielectric number as a Si device. A higher electric field strength in the second region 21 of a SiC device, however, also results in a higher electric field strength in the dielectric 40.

In order to prevent the maximum electric field strength in the dielectric 40 from reaching the dielectric strength of the dielectric 40 a SiC device may be implemented with a higher dopant dose of the doped region 121 than a silicon device. According to one example, the projected dopant dose of the first region is selected from a range of between 1E11 cm$^{-2}$ and 1E12 cm$^{-2}$ in a silicon device and is selected from a range of between 1E12 cm$^{-2}$ and 1E13 cm$^{-2}$ in a SiC device. The latter being 10 times the dopant dose in the silicon device. The "projected dopant dose" is the integral of the additional doping concentration of the region 121 in a direction perpendicular to the first sidewall 31. The "additional doping concentration" of the region 121 is given by the overall doping concentration minus the doping concentration of the second region 21. This additional doping concentration and, therefore, the region 121 can be obtained by implanting dopants via the first surface 31 into the second region 21 before forming the dielectric 40. In this implantation process, the dopants cannot be implanted vertically into the first sidewall 31, but a tilted implantation is used. The implantation dose in this tilted process is different from the projected implantation dose. The projected implantation dose can be calculated from the actual implantation dose in the tilted process and the tilt angle. The tilt angle is the angle between the first surface 101 and the implantation direction. If, hypothetically, the tilt angle would be 90° the projected implantation dose would be equal the actual implantation dose. In each other case, the projected implantation dose is given by actual implantation dose multiplied with $\sin(\alpha_T)$, where $\alpha_T$ is the tilt angle.

What is claimed is:

1. A semiconductor device, comprising:
a semiconductor body comprising a first surface, an inner region, and an edge region;
a pn junction between a first semiconductor region of a first conductivity type and a second semiconductor region of a second conductivity type, the pn-junction extending in a lateral direction parallel to the first surface of the semiconductor body in the inner region;
a recess extending from the first surface in the edge region into the semiconductor body, the recess comprising at least one sidewall including a first sidewall;
a dielectric filling the recess, wherein, a dielectric number of the dielectric decreases as a distance from the first sidewall in the lateral direction increases.

2. The semiconductor device of claim 1, wherein the dielectric comprises on the first sidewall a sequence of layers each having a substantially homogenous dielectric number, wherein the layers of the sequence have different dielectric numbers.

3. The semiconductor device of claim 2, wherein the sequence of layers comprises at least two layers.

4. The semiconductor device of claim 1, wherein the dielectric comprises a region where, in the lateral direction, the dielectric number decreases substantially continuously towards a center of the recess.

5. The semiconductor device of claim 1, wherein a maximum of the dielectric number is selected from a range of between 10 and 30.

6. The semiconductor device of claim 1, wherein a minimum of the dielectric number is selected from a range of between 2 and 5.

7. The semiconductor device of claim 1, wherein the dielectric comprises a polymer.

8. The semiconductor device of claim 7, wherein the polymer comprises benzocyclobutene (BCB).

9. The semiconductor device of claim 1, wherein the semiconductor body comprises a material selected from the group consisting of:
silicon;
silicon carbide;
gallium nitride; and
diamond.

10. The semiconductor device of claim 1, wherein the dielectric furthermore covers sections of the first surface adjoining the recess.

11. The semiconductor device of claim 10, wherein the dielectric that covers the sections of the first surface comprises a minimum dielectric number of the dielectric.

12. The semiconductor device of claim 1, wherein the semiconductor body further comprises an edge surface, and the dielectric covers the edge surface.

13. The semiconductor device of claim 1, wherein:
the semiconductor body further comprises an edge surface, and
the recess is spaced apart from the edge surface such that the recess comprises a second sidewall opposite the first sidewall, where the second sidewall is closer to the edge surface than the first sidewall.

14. The semiconductor device of claim 13, wherein, in the dielectric, the dielectric number decreases in the lateral direction towards a center of the recess as a distance to the first sidewall increases and the dielectric number decreases in the lateral direction towards the center of the recess as a distance to the second sidewall increases.

15. The semiconductor device of claim 1, wherein:
the semiconductor body further comprises an edge surface, and
the recess adjoins the edge surface.

16. The semiconductor device of claim 1, wherein the second semiconductor region in the lateral direction extends beyond the recess.

17. The semiconductor device of claim 16, wherein a third semiconductor region of the first conductivity type is arranged between the second semiconductor region and the recess.

18. The semiconductor device of claim 17, wherein the third semiconductor region has one of a higher doping concentration and a higher dopant dose in a region adjoining a bottom of the recess than in a region adjoining the first sidewall.

19. The semiconductor device of claim 17, wherein:
the semiconductor body is comprised of silicon, and
a projected dopant dose of the third region in the region adjoining the first sidewall is selected from a range of between $1E11$ cm$^{-2}$ and $1E12$ cm$^{-2}$.

20. The semiconductor device of claim 17, wherein:
the semiconductor body is comprised of silicon carbide, and
a projected dopant dose of the third region in the region adjoining the first sidewall is selected from a range of between $1E12$ cm$^{-2}$ and $1E13$ cm$^{-2}$.

21. The semiconductor device of claim 1, wherein:
the semiconductor body comprises a thickness and the recess comprises a depth in a vertical direction of the semiconductor body, and
the depth is less than 80%, less than 66% or less than 50% of the thickness.

22. The semiconductor device of claim 1, wherein:
the second semiconductor region comprises a thickness in a vertical direction of the semiconductor body and the recess has a depth in the vertical direction, and
the depth is less than 80%, less than 66% or less than 50% of the thickness of the second semiconductor region.

23. The semiconductor device of claim 1, wherein the recess in the vertical direction does not extend beyond the second semiconductor region.

24. The semiconductor device of claim 1, further comprising:
an edge surface of the semiconductor body;
a channel stopper region of the second conductivity type that is more highly doped than the second semiconductor region,
wherein the channel stopper region adjoins the edge surface and one of the first surface and a bottom of the recess.

25. The semiconductor device of claim 1, wherein the semiconductor device is implemented as a vertical diode in which the first semiconductor region forms a first emitter and the second semiconductor region forms a base region, and which further comprises:
a second emitter of the second conductivity type, wherein the base region is arranged between the first and the second emitters.

26. The semiconductor device of one of claim 1, wherein the semiconductor device is implemented as a transistor in which the first semiconductor region forms a body region and the second semiconductor region forms a drift region, and which further comprises:

at least one source region of the second conductivity type, wherein the body region is arranged between the source region and the drift region;
at least one gate electrode arranged adjacent to the body region and dielectrically insulated from the body region by a gate dielectric; and
a drain region, wherein the drift region is arranged between the drain region and the body region.

* * * * *